United States Patent [19]

Ishiwata et al.

[11] Patent Number: 4,999,242

[45] Date of Patent: Mar. 12, 1991

[54] RADIATION-CURABLE ADHESIVE TAPE

[75] Inventors: Shinichi Ishiwata, Hiratsuka; Michio Ueyama, Yokohama; Hiroyuki Nakae, Kawasaki; Yoshiyuki Funayama, Yokohama; Kazushige Iwamoto, Hiratsuka; Isamu Noguchi, Tokyo, all of Japan

[73] Assignee: Furukawa Electric Co., Ltd., Tokyo, Japan

[21] Appl. No.: 216,269

[22] Filed: Jul. 7, 1988

[30] Foreign Application Priority Data

| Jul. 8, 1987 | [JP] | Japan | 62-168515 |
| Mar. 31, 1988 | [JP] | Japan | 63-76185 |
| Mar. 31, 1988 | [JP] | Japan | 63-76186 |
| Apr. 1, 1988 | [JP] | Japan | 63-78201 |
| Apr. 1, 1988 | [JP] | Japan | 63-78202 |

[51] Int. Cl.$^5$ .................... B32B 7/12; B32B 15/04; C08J 3/28
[52] U.S. Cl. .................... 428/345; 428/354; 428/355; 522/117
[58] Field of Search .................... 428/345, 354, 355; 29/759; 522/117, 96, 95

[56] References Cited

U.S. PATENT DOCUMENTS

| 4,485,226 | 11/1984 | Noll et al. | 522/96 X |
| 4,640,727 | 2/1987 | Janssen | 428/345 X |
| 4,756,968 | 7/1988 | Ebe et al. | 428/345 X |
| 4,773,920 | 9/1988 | Chasman et al. | 428/411.1 X |

FOREIGN PATENT DOCUMENTS

| 3501726 | 1/1985 | Fed. Rep. of Germany | 428/345 |
| 60-004579 | 1/1985 | Japan | 428/345 |
| 60-196956 | 10/1985 | Japan . | |
| 60-201642 | 10/1985 | Japan . | |
| 61-28572 | 2/1986 | Japan . | |
| 62-10180 | 1/1987 | Japan . | |
| 62-59684 | 3/1987 | Japan . | |
| 63-17980 | 1/1988 | Japan . | |
| 63-027580 | 2/1988 | Japan | 428/345 |

OTHER PUBLICATIONS

Japanese Patent Application (OPI) 196956/1985.
Japanese Patent Application (OPI) 201642/1985.
Japanese Patent Application (OPI) 28572/1986.
Japanese Patent Application (OPI) 10180/1987.
Japanese Patent Application (OPI) 59684/1987.

*Primary Examiner*—William J. Van Balen
*Assistant Examiner*—D. R. Zirker
*Attorney, Agent, or Firm*—Birch, Stewart, Kolasch & Birch

[57] ABSTRACT

There is provided a radiation-curable adhesive tape comprising a radiation-curable adhesive layer which is formed on a radiation transmitting substrate. The radiation-curable adhesive layer is composed of an acrylic adhesive and radiation-curable compound having carbon-carbon double bonds. The radiation-curable tape can be used preferably in processing steps for the production of semiconductor wafer, ceramics and glass employing a direct picking-up system.

25 Claims, No Drawings

RADIATION-CURABLE ADHESIVE TAPE

BACKGROUND OF THE INVENTION

(1) Field of the Invention

The present invention relates to an adhesive tape that is used in a working step, wherein a semiconductor wafer (for example, consisting of Si and GaAs), ceramics, glass, etc. is cut or abraded.

(2) Description of Prior Art

Hitherto, in semiconductor wafer dicing to make chips, a direct picking-up system has been used, wherein the semiconductor wafer is stuck and secured on an adhesive tape, the wafer is cut with a rotating circular blade along the chip shape, the securing adhesive tape is expanded radially to lower the adhesive force securing the chips, thereby enabling the chips to be picked up one by one from the adhesive tape, so that the chips can be mounted on die.

In the above system, when the semiconductor wafer is cut with a rotating circular blade, for the purpose of cooling the rotating circular blade and to eliminate the cuttings, washing water pressurized to approximately 2 kg/cm$^2$ is discharged against the rotating circular blade and the semiconductor wafer. Therefore, the chip-securing adhesive force in the dicing process is required to withstand the cutting impact force of the rotating circular blade and this water pressure, and in this sense, the greater the adhesive force the better. However, if the chip-securing adhesive force is excessive, the picking-up of the chips from the adhesive tape becomes difficult. That is, when it is required that the chip-securing adhesive force for the dicing process and the chip-securing adhesive force for the picking-up be controlled in accordance with the size of the chip, and the adhesive force of the adhesive tape set in accordance with the size of the chip, then in the case of chips having a size of 25 mm$^2$ or over, such as chips for recent LSI, whose integration degree has increased, the individual chip-securing adhesive force becomes high. As a result, a problem occurs in that the picking-up from the adhesive tape becomes difficult, and does not allowing a direct picking-up step to be applied.

To overcome this problem, adhesive tapes for securing a semiconductor wafer have been suggested that comprise a support through which radiation, such as ultraviolet rays or ionizing radiation such as an electron beam, can pass, and an adhesive layer that is applied on the support and is cured when irradiated, the chip-securing adhesive force in the dicing process is made high, and after the semiconductor wafer is cut and separated into chips, the tape is irradiated from the support side with radiation to cure the radiation-curable adhesive layer, thereby lowering the chip-securing adhesive force considerably, so that chips, regardless of size, such as of size of 25 mm$^2$ or over, can be easily picked up.

Some adhesive tape suggestions have provided for semiconductor wafer-securing adhesive tapes having a radiation-transmitting support coated with a radiation-curable adhesive. These tapes are based on the principle that when the radiation-curable compound in the adhesive is cured it causes the adhesive to have a three-dimensional structure so that the fluidity of the adhesive is greatly lowered, and as a result the chip-securing adhesive force is lowered remarkably. Examples of such adhesive tapes are those disclosed in Japanese Patent Application (OPI) Nos. 196956/1985, 201642/1985, 28572/1986, and 10180/1987.

In the semiconductor wafer processing steps using a radiation-curable tape (e.g., sticking, cutting, grinding, polishing, radiation, and picking-up) such problems as described below may occur.

The surface state of semiconductor wafers that will be stuck on semiconductor wafer-securing adhesive tapes are not always specular or almost specular. That is, usually the wafer surface is subjected to a grinding treatment, etching treatment, or special treatment wherein a metal such as gold is deposited, and this results in a number of fine crevices in the wafer surface. Consequently, fluidization of the adhesive cannot be fully prevented by simply causing the adhesive layer to have a three-dimensional network after irradiation, and therefore the chip-securing adhesive force changes conspicuously depending on the surface state of the wafer. As a result, in some cases the picking-up of even chips having a size of 25 mm$^2$ or below becomes difficult. Thus the change in the chip-securing adhesive force after irradiation due to the surface state of the chips (where sticking will be effected) leads to the problem that the picking-up workability lowers greatly, thereby lowering chip productivity.

Further, a film comprising a single resin layer, for example of that a polyvinyl chloride or ethylene-vinyl acetate copolymer is usually used as the substrate of a radiation-curable adhesive tape, but when it is desired to process the semiconductor wafer at a higher speed and more efficiently on an industrial production level, further problems mentioned below may arise.

When a semiconductor wafer or the like is diced using a radiation-curable adhesive tape, considerable tension is exerted on the adhesive tape because the support film is under the influence of an impact due to the cutting work by a rotating circular blade into the semiconductor wafer stuck on the adhesive tape, as well as being under the influence of the weight of the semiconductor wafer itself. Due to resulting tension, the support film is expanded, and sometimes the middle part of the adhesive tape may slacken and sink. When the thus-slackened adhesive tape is housed in a carrier cassette to be transported to the next step, such problems as the tape failing be suitably housed or wafer-to-wafer contact in the carrier cassette can arise. Also, due to the slackening of the adhesive tape, the interval between the chips may become narrow, and the adjacent ends of the chips may touch, damaging the chips, which is another problem. Further, the radiation-curable adhesive tape will be subjected to irradiation to lower the chip-securing adhesive force as the pretreatment for picking up the chips in the irradiation process, wherein the adhesive tape is heated by light in the infrared range which falls on the adhesive tape. As a result, further expansion or partial wrinkling of the adhesive tape is caused by the heat or the like. Since this expansion or wrinkling will be retained until the final step where the radiation-curable adhesive is cured and the chips are picked up, the expansion and wrinkling not only present in the adhesive tape from being housed in a carrier cassette used for transportation between the steps, but also from irradiation, cause uneven intervals between the chips, leading to incomplete picking-up of the chips.

On the other hand, in such a system wherein the adhesive force is lowered by providing a three-dimensional network to the adhesive by the curing reaction of a radiation-curable compound, the rubber-like properties of the adhesive tape retained during the dicing step almost disappear when the picking-up operation is performed and therefore, a problem arises in that the radial expansion of the adhesive tape that has hitherto been performed cannot now be done. This expansion of the tape, which will be carried out, or will not be carried out, depending on the performance of the wafer processing apparatus or the size of the chips, is carried out to prevent the adjacent chips from touching and damaging the circuit surface when the chips are picked up from the adhesive tape, because the interval between the chip cut by the rotating circular blade is too small. As a method of obviating this problem, an adhesive tape is suggested that will be irradiated after the tape has been expanded, as disclosed in Japanese Patent Application (OPI) No. 59684/1987. In that case, a resin having rubber-like properties is made of a resin such as polybutene, polyurethane, and 1,2-polybutadiene. Before irradiation these resins can be expanded to form an interval between the chips large enough to prevent the chips from touching, but if one tries to make the interval between the chips large enough to accomodate a picking-up apparatus that recognizes an image so that the chips are picked up, the intervals between the chips become ununiform due to necking of the film itself, and also the film is deteriorated due to irradiation or due to expanding after the irradiation, resulting in a disappearance of the rubber-like properties, so that such an enlargement of the interval between chips becomes workably impossible. The adhesive of this adhesive tape is identical with that disclosed in Japanese Patent Application (OPI) No. 19695/1985, and the expansion of the adhesive tape is to be performed before the irradiation. Generally, when expansion is carried out after irradiation, since the expanded tape is heated by the heat of the irradiation, there occurs the disadvantage that the chips are not arranged uniformly (the aligning property becomes poor). Further, in such a method, apparatuses for picking up chips that have been conventionally used by semiconductor manufacturers cannot be suitably used. (Generally an expanding mechanism is incorporated in a picking-up apparatus, and irradiation is performed before the step of expanding the adhesive tape.)

BRIEF SUMMARY OF THE INVENTION

The main object of the present invention is to provide a radiation-curable adhesive tape that retains the advantages of conventional radiation-curable adhesive tapes and is free from the above problems. That is, the main object of the present invention is to provide a radiation-curable adhesive tape suitable for the processing steps of a semiconductor wafer and the like, employing a direct picking-up system.

One of the objects of the present invention is to provide a radiation-curable adhesive tape wherein the advantages of conventional radiation curable adhesives are retained and the dependence of the chip-securing adhesive force on the surface state of a semiconductor wafer has been remarkably reduced for the later picking-up step.

Another object of the present invention is to provide a radiation-curable adhesive tape that will neither be extended nor slackened when a semiconductor wafer is stuck on the adhesive tape and diced, and also will not be further extended or partially wrinkled when the adhesive tape is irradiated to lower the chip-securing adhesive force for the attainment of the picking-up system.

Another object of the present invention is to provide a radiation-curable adhesive tape such that if the adhesive tape is extended or slackened by some external factors, the extended state or the slackened state of the adhesive tape is amended quickly by the heating action during irradiation and by cooling after irradiation.

A still further object of the present invention is to provide a radiation-curable adhesive tape such that after being irradiated the adhesive tape is provided with rubber-like properties, the chip-securing adhesive force can be lowered, and the adhesive tape can be expanded for the attainment of the picking-up system.

Other and further objects, features, and advantages of the invention will become apparent more fully from the following description.

DETAILED DESCRIPTION OF THE INVENTION

The term "adhesive tape" means a pressure-sensitive adhesive tape, and the term "adhesive" means a pressure-sensitive adhesive, in this specification and the claims.

The inventors have studied many ways to overcome the defects of the prior radiation-curable adhesive tapes, and have found that when a certain radiation polymerizable cyanurate compound or isocyanurate compound is used in a prescribed proportion in an acrylic adhesive, the adhesive can be cured by irradiation to form a three-dimensional structure, and at the same time the cured adhesive is rendered flexible, and the chip-securing adhesive force can be caused to lower stably, independent of the roughness of the surface of the chips where the sticking is effected, all of which have led to the completion of the present invention.

Thus, according to one of the preferable embodiments of the present invention, there is provided a radiation-curable adhesive tape, which comprises a radiation transmitting substrate, and a radiation-curable adhesive layer formed thereon which contains 100 parts by weight of an acrylic adhesive and 5 to 500 parts by weight of at least one compound selected from a group consisting of cyanurate compounds and isocyanurate compounds having carbon-carbon double bonds other than triallyl cyanurate.

Further, it is found that the chip-securing force is more stably lowered irrespective of the state of the surface of the chip, where the sticking is effected, by adding a silicone acrylate in a prescribed proportion into a radiation-curable acrylic adhesive.

Thus, according to one of the preferable embodiments of the present invention there is provided a radiation-curable adhesive tape that comprises a radiation-curable adhesive layer that is formed on a radiation-transmitting substrate that contains 100 parts by weight of an acrylic adhesive, 5 to 500 parts by weight of a compound having a carbon-carbon double bond, and 0.01 to 20 parts by weight of a silicone acrylate compound.

Further it is found that an adhesive tape having more excellent properties can be provided by using, as the film substrate, a multilayer film having two or more different constituting layers therein, leading to the present invention.

Thus, according to one of the preferable embodiments of the present invention, there is provided a radiation-curable adhesive tape that comprises a radiation-curable adhesive layer that is formed on a radiation-transmitting substrate consisting of a multi-layer film having at least two different constituting layers therein, and which contains 100 parts by weight of an acrylic adhesive and 5 to 500 parts by weight of a compound having a carbon-carbon double bond.

The inventors also have variously studied to obtain such adhesive tapes that when a wafer is stuck on the adhesive tape and dicing is carried out, the tape will not be extended or slackened, or even if the tape is extended or slackened, the extended state or the slackened state can be cancelled after irradiation. As a result, it has been found that when the support film of the radiation-curable adhesive tape consists of at least two types of resins, and as at least one of the resins, use is made of a high-density polyethylene, preferably or polypropylene, even a non-oriented film can be shrunk favorably by irradiation, and the extended or slackened state formed by tension or the like exerted on the adhesive tape can be canceled.

Thus, according to one of the preferable embodiments of the present invention, there is provided a radiation-curable adhesive tape that includes, as the radiation-transmitting support film, at least two different resin layers, and a radiation-curable adhesive layer provided on one surface of the supporrt film, with at least one of the layers constituting the support film being a high-density polyethylene resin layer or polypropylene resin layer.

With respect to radially expandable adhesive tapes, although the inventors initially paid attention to, as support films for adhesive tapes, soft vinyl chloride film having rubber-like properties that can be expanded uniformly, it was confirmed that such soft vinyl chloride resin film is subject to detioration, for example, by ozone in the atmosphere, and that it is activated through irradiation, thereby allowing chlorine in the molecule to be set free readily. Further, it leaves adhesive on the chip, that is considered to be brought about by chlorine gas entering the adhesive layer. Various studies have been made to overcome these defects, and as a result it has been found that when a film consisting of three-different radiation transmitting constituting resin layers, with the intermediate layer being soft vinyl chloride resin (hereinafter referred to as PVC resin) or elastomer (rubber), is used as a support film of a radiation-curable adhesive tape, the intervals between the chips cut and separated by a rotating circular blade can be spread uniformly, and the intervals between the chips required for a picking-up apparatus that recognizes an image (so that the chips are picked up) can be increased considerably.

A further excellent tape can be obtained when, as the composition of the adhesive, the composition mentioned below is used. That is, it has been found that when, as the radiation-curable adhesive layer to be applied on one surface of the support film, a urethane acrylate compound that includes carbon-carbon double bonds in a prescribed proportion in an acrylic adhesive, and an adhesive consisting of a cyanurate or isocyanurate compound that will have rubber-like properties as physical properties after irradiation are used, the radiation-curable adhesive layer can be cured through irradiation, thereby forming a three-dimensional network, and that at the same time flexibility can be provided, and a stable effect of the chip-securing adhesive force can be exhibited irrespective, for example, of the surface roughness of the chips, and the present invention has been completed on the basis of this finding.

Thus, according to one of the preferable embodiments of the present invention, there is provided a radiation-curable adhesive tape that comprises a support film made up of at least three radiation-transmitting constituting resin layers, with the intermediate layer being a soft vinyl chloride resin or elastomer (rubber), and a radiation-curable adhesive layer formed on one surface of said support film containing an urethane acrylate compound.

The acrylic adhesives used in the present invention comprise homopolymers whose major component is an ester of acrylic acid, or methacrylic acid, and copolymers of acrylic acid, or methacrylic acid, or its ester, or its acid amide with other copolymerizable monomers, and mixtures of these polymers. As the monomers and comonomers can be mentioned, for example, alkyl esters of acrylic acid or methacrylic acid, such as methyl esters, ethyl esters, butyl esters, 2-ethylhexyl esters, octyl esters, glycidyl esters, hydroxymethyl esters, 2-hydroxyethyl esters, and hydroxypropyl esters; and amides and N-substituted amides of acrylic acid and methacrylic acid, such as N-hydroxymethylacrylic acid amide, or methacrylic acid amide. If required, acrylic adhesives can be used that contain a crosslinking agent, such as polyisocyanate compounds or alkyletherified melamine compounds. The acrylic adhesives per se are known and described, for example, in the Japanese Patent Applications referred to above.

Cyanurate compounds or isocyanurate compounds used in the radiation-curable adhesive of the present invention are compounds that have a triazine ring or isotriazine ring in the molecule, contain radiation-polymerizable carbon-carbon double bonds, and they may be in the form of a monomer, oligomer, or a mixture thereof. Compounds having a triazine ring or an isotriazine ring can generally be synthesized by the usual cyclization reaction using, as raw material, halocyan compounds, dianiline compounds, diisocyanates compounds, and the like. Further, a radiation-curable carbon-carbon double bond-containing groups, for example, a functional group containing a vinyl group, an allyl group, an acryloxy group, or a methacryloxy group is introduced into the thus-synthesized compound to give a compound that will be used in the present invention. In the present invention, one containing an acryloxy group or methacryloxy group is preferably used.

In the present invention, beside the above-mentioned point, there is no particular limitation on the cyanurate or isocyanurate compounds, but it is preferable that the carbon-carbon double bond introduced into the triazine ring or isotriazine ring does not have a so-called rigid molecular structure, that is, does not contain, for example, an aromatic group or a heterocyclic group. This is because the adhesive of the present invention becomes excessively brittle if the radiation polymerizable compound is made excessively rigid by the introduction of a carbon-carbon double bond-containing group. Therefore, it is preferable that the linking group between the carbon-carbon double bond and the triazine ring or isotriazine ring is a group wherein the atoms can rotate freely. Examples of such a group are aliphatic groups such as alkylene groups and alkylidene groups, which may have a —O—, —OCO—, —COO—, —NHCO— or —NHCOO— bond. If the carbon-carbon double bond is linked to the triazine ring or isotriazine ring via —O—, it is desirable that the number of carbon atoms between carbon of the double bond and the oxygen is two or more.

Examples of the cyanurate or isocyanurate compounds include 2-propenyl di-3-butenylcyanurate, 2-hydroxyethyl bis(2-acryloxyethyl) isocyanurate, tris(acryloxyethyl) isocyanurate, tris(methacryloxyethyl) isocyanurate, bis(2-acryloxyethyl) 2-(5-acryloxy)hexyloxyethyl isocyanurate, tris(1,3-diacryloxy-2-propyloxycarbonylamino-n-hexyl) isocyanurate, and tris(1-acryloxy-3-methacryloxy-2-propyl-oxycarbonylamino-n-hexyl) isocyanurate.

Generally the number of radiation polymerizable carbon-carbon double bonds per monomer of the said cyanurate compound or isocyanurate compound used in the present invention or per repeating unit of the oligomer thereof is preferably at least 2, and more preferably 2 to 6. If the number of the double bonds is less than 2, a degree of crosslinking enough to lower the adhesive strength by irradiation cannot be obtained, while if the number exceeds 6, sometimes the brittleness of the adhesive after the radiation cure becomes excessive.

The content of the cyanurate compound or isocyanurate compound in the radiation-curable adhesive of the present invention is generally 5 to 500 parts by weight, preferably 60 to 150 parts by weight, for 100 parts by weight of the acrylic adhesive. If the content is too small, it is not preferable because the three-dimensional network of the radiation-curable adhesive that is formed by the irradiation becomes inadequate, it cannot prevent fluidization of the acrylic adhesive, and the chip-securing adhesive force cannot be lowered enough to allow the chips to be picked up easily. In contrast, if the content is too high, the plasticizing effect on the acrylic adhesive becomes too high, and the chip-securing adhesive force obtained will not be strong enough to withstand the cutting impact force by the rotating circular blade or the water pressure of the washing water in the dicing process.

The urethane acrylate compound used in the radiation-curable adhesive of the present invention is a compound that contains two carbon-carbon double bonds polymerizable by irradiation, has rubber-like properties as physical properties after curing by irradiation, and is a urethane acrylate-type compound having a linear aliphatic molecular structure, such as polyesters or polyols having a urethane bond in the molecule, which may be in the form of a monomer or an oligomer. Such a compound can be synthesized by using, as raw material, for example, methacrylic acid, 2-hydroxyethyl acrylate, 2-hydroxylethyl methacrylate, 2-hydroxypropyl acrylate, 2-hydroxypropyl methacrylate, or polyethylene glycol acrylate, and a polyvalent isocyanate compound such as 2,4-tolylene diisocyanate, 2,6-tolylene diisocyanate, 1,3-xylylene diisocyanate, 1,4-xylylene diisocyanate, and diphenylmethane-4,4-diisocyanate.

Herein the term "rubber-like properties" of the urethane acrylate-type compounds after curing by irradiation means properties such that, in the tensile strength and elongation measurement (JIS-K7113), the tensile strength at breaking is 100 kg/cm$^2$ or below, preferably 50 kg/cm$^2$ or below, and the tensile elongation at breaking is at least 50%.

The content of the urethane-type acrylate compound in the radiation-curable adhesive of the present invention is preferably 0.5 to 100 parts by weight, and more preferably 10 to 100 parts by weight, for 100 parts by weight of the acrylic adhesive. The inclusion of the urethane-type acrylate compound affects the flexibility of the three-dimensional network of the radiation-curable adhesive formed by irradiation, preventing the plasticizing effect on the acrylic adhesive.

Compounds having carbon-carbon double bonds as the curable adhesive of the present invention include, in addition to the above cyanurate or isocyanurate compounds, such other radiation-curable compounds as polyacrylates or polymethacrylates of aliphatic polyols. Examples of these compounds are acrylates or methacrylates of ethylene glycol, diethylene glycol, trimethylolpropane, 1,4-butanediol, 1,6-hexanediol, pentaerythritol, dipentaerythritol, and polyethylene glycols (having 3 to 14 carbon atoms), and their oligomers. These compounds can be used together with a cyanurate compound or isocyanurate compound having carbon-carbon double bonds, even when the latter is needed.

In the present invention a silicone (metha)acrylate (i.e., acrylate or methacrylate) is a silicone resin modified with a (metha)acrylate, and, for example, can be synthesized by a demethanolation reaction, wherein an organofunctional methoxysilane and a silanol-group-containing polysiloxane are condensed.

If the functional number is expressed as the number of the (metha)acryl groups present in the molecular chain of the silicone (metha)acrylate, two or more functions are preferable, and particularly a silicone (metha)acrylate having four to six functions is preferable in the present invention.

In the present invention the amount of such a silicone (meth)acrylate to be added is generally 0.01 to 20 parts by weight, preferably 0.1 to 10 parts by weight, and more preferably 0.5 to 4 parts by weight for 100 parts by weight of the acrylic adhesive.

In the present invention the term "radiation" means light rays, such as ultraviolet rays or ionizing radiations such as an electron beam, and ultraviolet rays are used preferably.

If the adhesive tape of the present invention is cured with ultraviolet ray irradiation, photopolymerization initiators can additionally be used, for example, isopropylbenzoin ether, isobutylbenzoin ether, benzophenone, Michler's ketone, chlorothioxanthone, dodecylthioxanthone, dimethylthioxanthone, diethylthioxanthone, benzyldimethylketal, α-hydroxycyclohexyl phenyl ketone, and 2-hydroxymethylphenylpropane. When one or more of these are added to the adhesive layer, if the curing reaction time is shortened or the amount of ultraviolet rays for irradiation is reduced, the curing reaction can be allowed to efficiently proceed to lower the chip-securing adhesive force.

If necessary, the radiation-curable adhesive used in the present invention may contain, for example, a tackifier, a viscosity modifier, a surface-active agent, or other modifiers, and conventional components.

For the radiation transmitting substrate used in the present invention, plastic or elastmer ("Resin" or "polymer" is given in this specification and claims as a general term to these) is preferably used, and there is no particular limit on the material as long as it can transmit radiation. If the radiation-curable adhesive is cured by irradiation with ultraviolet rays, it is required to use, as a substrate for it, one good in light transmission. Examples of polymers used for such a substrate include homopolymers or copolymers of α-olefins such as polyethylenes, polypropylenes, ethylene/propylene copolymers, polybutene-1, poly-4-methylpentene-1, ethylene/vinyl acetate copolymers, ethylene/ethyl acrylate copolymers, ethylene/methyl acrylate copolymers, ethylene/acrylic acid copolymers, and ionomers, or mixtures thereof; vinyl chloride-type homopolymers, or copolymers such as polyvinyl chloride, vinyl chloride-/ethylene copolymers, vinyl chloride/vinyl acetate copolymers, and vinyl chloride/ethylene/vinyl acetate copolymers; fluorine-type polymers, such as vinyl fluorine/ethylene copolymers, vinylidene fluoride-/ethylene copolymers, and FEP (fluorinated ethylene propylene); and engineering plastics, such as polyethylene terephthalate, polycarbonate, and polymethyl methacrylate. The substrate is generally in the form of a sheet or film (referred to as film in this specification and claims), and it is desirable that the thickness of the substrate is generally on the order of 10 to 1000 μm.

Although there is no particular limit on the thickness of the radiation-curable adhesive layer on the substrate, the thickness of the radiation-curable adhesive layer is generally 2 to 50 μm.

In the present invention, when a multilayer film is used, the constitutional layers have different properties from each other. At least one of them is a constituent layer acting mainly to provide required mechanical properties (e.g., rigidity, strength, extensibility and softness), and at least one other layer is a constituent layer acting mainly to give a firm adhesion with the adhesive.

As the radiation-transmitting substrate used in the present invention, preferably use can be made, for example, of plastics and elastomers, and there is no particular limit on the substrate material as long as it can transmit radiation.

In the present invention, at least one of the layers constituting the multilayer film is used to provide mechanical properties, as mentioned before, and examples of polymers that can be used for such a constituting layer include such polymers as enumerated above for radiation-transmitting substrates. The thickness of the said constituting layer is generally 10 to 50 μm, and preferably 30 to 300 μm.

In this invention, one other layer constituting the multilayer film is used mainly to give fim adhesion with the adhesive, as mentioned before, and the polymer that constitutes said layer is a so-called adhesive polymer, specifically a copolymer of an α-olefin. Specific examples thereof include ethylene/vinyl acetate copolymers, ethylene/ethyl acrylate copolymers, ethylene/methyl acrylate copolymers, ethylene/acrylic acid copolymers, and ionomers.

The thickness of said adhesive layer is 2 to 50 μm. The adhesive layer surface is, in some cases, modified, for example, by a corona treatment or anchoring treatment to make the adhesion of the adhesive layer surface firm to the adhesive.

Examples of constructions of the multi-layer film used as a substrate in the present invention include one with a layer to provide mechanical properties (referred to as layer A), on which a layer for providing adhesion with the adhesive (referred to as layer B) is laminated; a construction having a layer A and layers B, with layer A sandwiched between the layers B; and a construction wherein two or more layers A and two or more layers B are alternatively laminated. In these constructions, in order to increase the adhesion between the layer A and B layer, in some cases, a bonding agent is interposed between them.

The high-density polyethylene used in the present invention is one obtained by the known polyethylene polymerization method, and also includes those represented by moderate pressure and low pressure polyethylenes. Preferably, high-density polyethylenes or polypropylenes having a Vicat softening point of at least 120° C. are used.

Generally, the suitable thickness of such a support film is 30 to 300 μm in view of the strength/elongation properties and radiation-transmitting properties desired. The thickness of the resin layer made of high-density polyethylenes or polypropylenes is arbitrarily set in accordance with the required properties for the support film, and is generally in the range of 3 to 90% of the total thickness of the support film.

As the support film of the radiation-curable adhesive tape of the present invention suitable for radial expansion, preferably use is made of one that is made of at least three radiation-transmitting constituting resin layers, with a soft PVC (poly (vinyl chloride)) resin or elastomer (rubber) used as the intermediate layer, and one that has that rubber-like properties that allow the film to be expanded uniformly.

Soft polyvinyl chlorides used in the present invention are typically those to which a phthalate, (such as dibutyl phthalate, dioctyl phthalate, dinonyl phthalate, and diisodecyl phthalate), other polyester-type plasticizer, epoxy-type plasticizer, or trimellitate-type plasticizer has been added, but vinyl chloride-type copolymers such as urethane/vinyl chloride copolymers, ethylene/-vinyl chloride copolymers, vinyl acetate/vinyl chloride copolymers, and ethylene/vinyl acetate/vinyl chloride copolymers, and mixtures of these, or mixtures of these with other resins or elastomers can also be used. These copolymers naturally include graft copolymers, and the above mixtures naturally include so-called alloys.

As an elastomer (rubber), use can be made of common rubbers such as polyisoprene, and thermoplastic elastomers such as olefin-type thermoplastic elastomers.

It is required that one use, as a resin layer other than the soft polyvinyl chloride resin or thermoplastic elastomer in the support film, a resin that does not deteriorate the rubber-like properties of the support film, allows the transmission of radiation, and is flexible. Polymers that can be used as such a resin include homopolymers or copopolymers of α-olefins, such as polyethylenes, ethylene/propylene copolymers, polypropylenes, ethylene/vinyl acetate copolymers, polybutene, polymethylpentenes, ethylene/ethyl acrylate copolymers, ethylene/methyl acrylate copolymers, and ethylene/acrylic acid copolymers, and ionomers, and mixtures thereof.

Herein the term "rubber-like properties" of the support film means properties such that, in the tensile strength and elongation measurement (JIS-Z0237), the ratio of 50% modulus (20° C.) to 25% modulus (20° C.) is at least 1.2, preferably 1.5 or over, and 25% modulus (20° C.) is 50 kg/cm$^2$ or below.

The thickness of the support film is preferably 30 to 300 μm in view of the transmission of radiation. Of these, the thickness of the intermediate layer of soft PVC resins or thermoplastic elastomers is 25 to 290 μm, which is set arbitrarily in accordance with required properties.

In the present invention, although there is no particular limit on the thickness of the radiation-curable adhesive layer, the thickness is generally 2 to 50 μm.

Generally, the radiation-curable adhesive tape of the present invention has a separator film on the radiation-curable adhesive layer. Therefore, in many cases the state of the radiation-curable adhesive tape of the present invention, before it is used, has such a construction that it has three layers, that is, a substrate, an adhesive layer, and a separator. The separator is made, for example, of polyolefin film, such as polypropylene film or the like, or polyethylene terephthalate film. It is a matter of course that the separator is removed when the radiation-curable adhesive tape is used.

When the radiation-curable adhesive tape of the present invention is used, for example, it exhibits such an excellent effect that the tape has a chip-securing adhesive force adequate to secure the severed chips when the semiconductor wafer is cut into chips (that is, when the dicing process is carried out), and since the adhesive layer takes a three-dimensional structure and is flexible after irradiation, a stable low adhesive force can be obtained irrespective of the surface property of the semiconductor wafer, and the severed chips can be picked up from the securing tape easily at all times.

Further, the present invention exhibits such an excellent effect that, after the wafer is cut into chips, the adhesive tape is radially expanded, since the intervals between the chips can be spread uniformly, the chips can be picked up easily without being damaged.

Thus, by use of the adhesive tape the processing including picking-up system can be conducted without any problems.

The above advantages can also be applied to the processing of ceramics glass, etc.

The present invention will now be described in further detail with reference to examples.

EXAMPLE 1

To 100 pts. wt. (parts by weight) of an acrylic adhesive (copolymer of 2-ethylhexyl acrylate and n-butyl acrylate) were added 3 pts. wt. of a polyisocyanate compound (of trade name Colonate L, manufactured by Nippon Polyurethane Co., Ltd. (Japan)), 60 pts. wt. of tris-2-acryloxyethyl isocyanurate as an isocyanurate compound, and 1 pt. wt. of α-hydroxycyclohexyl phenyl ketone as a photopolymerization initiator, and they were mixed to prepare a radiation-curable adhesive. The adhesive was applied to one surface of a polyethylene terephthalate film having a thickness of 50 μm so that the thickness of the adhesive layer might be 15 μm, and the adhesive was dried by heating to obtain a semiconductor wafer-securing adhesive tape.

Each silicon wafer having a diameter of 5 inches was stuck onto the above semiconductor wafer-securing adhesive tape, and the adhesive force was measured according to JIS (Japanese Industrial Standard)-Z0237 before and after irradiation with ultraviolet rays (90° peeling; at a peeling rate of 50 mm/min; this method was applied to the Examples and Comparative Examples described below). In this case, three surface states of the wafer where the adhesive tape was stuck were tested, that is, one surface was specular, one was finished with a #600 grinder manufactured by DISCO ABRASIVE SYSTEMS, Ltd. (Japan) (the surface roughness corresponding to a surface ground with diamond having a size corresponding to U.S. mesh #600), and the other surface was finished with a #1000 grinder manufactured by DISCO ABRASIVE SYSTEMS, Ltd. (Japan) (the surface roughness corresponding to a surface ground with diamond having a size corresponding to U.S. mesh #1000). The ultraviolet lamp used was a high pressure mercury vapor lamp (80 w/cm), and the irradiation time was 10 sec. The results of the measurement of the adhesive force are given in Table 1 below.

TABLE 1

| Experiment No. | Surface state of wafer | Adhesive strength before irradiation with UV rays (g/25 mm) | Adhesive strength after irradiation with UV rays (g/25 mm) |
|---|---|---|---|
| 1 | specular | 1,150 | 24 |
| 2 | surface finished with #1000 | 1,220 | 25 |
| 3 | surface finished with #600 | 1,250 | 29 |

As shown in the above measurement results, the adhesive strength of the adhesive tape of the present invention after irradiation with ultraviolet rays had an approximately uniform value irrespective of the surface state of the wafer.

When a silicon wafer having a diameter of 5 inches secured to the above adhesive tape was cut with a dicing saw into relatively large chips measuring 5×5 mm, after which the tape was dried and exposed to a high pressure mercury vapor lamp (80 w/cm) for 10 sec, and picking up the chips were attempted, any of the chips under experiment Nos. 1 to 3 shown above could be picked up easily.

COMPARATIVE EXAMPLE 1

To 100 pts. wt. of an acrylic adhesive (the same as in Example 1) were added 3 pts. wt. of a polyisocyanate compound (the same as in Example 1), 40 pts. wt. of dipentaerythritol monohydroxypentaacrylate, and 1 pt. wt. of α-hydroxycyclohexyl phenyl ketone, and, as in Example 1, a semiconductor wafer-securing adhesive tape was prepared.

With respect to the above semiconductor wafer-securing adhesive tape, the adhesive force to three surface states of a silicon wafer was measured under the same conditions as in Example 1. The results of the measurement are given under experiment Nos. 1 to 3 in Table 2.

TABLE 2

| Experiment No. | Surface state of wafer | Adhesive strength before irradiation with UV rays (g/25 mm) | Adhesive strength after irradiation with UV rays (g/25 mm) |
|---|---|---|---|
| 1 | specular | 800 | 35 |
| 2 | surface finished with #1000 | 840 | 42 |
| 3 | surface finished with #600 | 920 | 57 |

As is apparent from the results of experiment Nos. 1 to 3 shown in Table 2, the adhesive strength of the adhesive tape after irradiation with ultraviolet rays changed due to the surface state of the wafer, and the rougher the surface, the greater the value of the adhesive strength.

When a silicon wafer having a diameter of 5 inches that was secured to the above adhesive tape was cut, irradiated with light, and subjected to pick-up testing as in Example 1, the chips could be picked up easily from the specular surface (experiment No. 1), but there was high pick-up resistance for the other surfaces (experiment Nos. 2 and 3), and some chips could not be picked up.

EXAMPLE 2

To 100 pts. wt. of an acrylic adhesive (copolymer of 2-ethylhexyl acrylate, ethyl acrylate, hydroxymethyl acrylate, and acrylic acid) were added 2.5 pts. wt. of a polyisocyanate compound (the same as in Example 1), 60 pts. wt. of tris-4-acryloxy-n-butyl isocyanurate as an isocyanurate compound, and 1 pt. wt. of α-hydroxycyclohexyl phenyl ketone as a photopolymerization initiator, followed by mixing to prepare a radiation-curable adhesive. The adhesive was applied to one surface of a polyethylene terephthalate film having a thickness of 50 μm to form an adhesive layer of 20 μm thickness, and it was then dried by heating to prepare a semiconductor wafer-securing adhesive tape.

Each silicon wafer having a diameter of 5 inches was stuck onto the above semiconductor wafer-securing adhesive tape, and the adhesive force was measured according to JIS-Z0237 before and after irradiation with ultraviolet rays. In this case, three surface states of the silicon wafer where the adhesive tape were stuck were tested, that is, one surface was specular, one was finished with a #600 grinder manufactured by DISCO ABRASIVE SYSTEMS, Ltd. (Japan), and the other surface was finished with a #1000 grinder. The ultraviolet lamp used was a high pressure mercury vapor lamp (80 w/cm), and the irradiation time was 10 sec. The results of the measurement of the adhesive force are given in Table 3 below.

TABLE 3

| Experiment No. | Surface state of wafer | Adhesive strength before irradiation with UV rays (g/25 mm) | Adhesive strength after irradiation with UV rays (g/25 mm) |
|---|---|---|---|
| 1 | specular | 950 | 21 |
| 2 | surface finished with #1000 | 960 | 22 |
| 3 | surface finished with #600 | 1,000 | 26 |

As shown in the above measurement results, the adhesive strength of the adhesive tape of the present invention after irradiation with ultraviolet rays had an approximately uniform value irrespective of the surface state of the wafer.

When a silicon wafer having a diameter of 5 inches that was secured to the above adhesive tape was cut, irradiated with light, and subjected to pick-up testing as in Example 1, any of the chips under experiment Nos. 1 to 3 shown above could be picked up easily.

COMPARATIVE EXAMPLE 2

To 100 pts. wt. of an acrylic adhesive (the same as in Example 2) were added 3 pts. wt. of a polyisocyanate compound (the same as in Example 2), 40 pts. wt. of dipentaerythritol hexacrylate, and 1 pt. wt. of α-hydroxycyclohexyl phenyl ketone to prepare a semiconductor wafer-securing adhesive tape in the same manner as in Example 2.

With respect to the above semiconductor wafer-securing adhesive tape, the adhesive force to three surface states of a silicon wafer was measured under the same conditions as Example 2. The results of the measurement are given under experiment Nos. 1 to 3 in Table 4.

TABLE 4

| Experiment No. | Surface state of wafer | Adhesive strength before irradiation with UV rays (g/25 mm) | Adhesive strength after irradiation with UV rays (g/25 mm) |
|---|---|---|---|
| 1 | specular | 830 | 31 |
| 2 | surface finished with #1000 | 940 | 45 |
| 3 | surface finished with #600 | 980 | 65 |

As is apparent from the results of experiment Nos. 1 to 3 shown in Table 4, the adhesive strength of the adhesive tape after irradiation with ultraviolet rays changed due to the surface state of the wafer, and the rougher the surface, the greater the value of the adhesive strength.

When a silicon wafer having a diameter of 5 inches that was secured to the above adhesive tape was cut, irradiated with light, and subjected to pick-up testing as in Example 2, the chips could be picked up easily from the specular surface (experiment No. 1), but there was high pick-up resistance for the other surfaces (experiment Nos. 2 and 3), and some of chips could not be picked up.

EXAMPLE 3

To 100 pts. wt. of an acrylic adhesive (copolymer of 2-ethylhexyl acrylate, ethyl acrylate, hydroxymethyl acrylate, and acrylic acid) were added 2.5 pts. wt. of a polyisocyanate compound (the same as Example 1), 85 pts. wt. of tris(1,3-diacryloxy-2-propyl-oxycarbonylamino-n-hexyl) isocyanurate as an isocyanurate compound, and 1 pt. wt. of α-hydroxycyclohexyl phenyl ketone as a photopolymerization initiator, followed by mixing to prepare a radiation-curable adhesive. The adhesive was applied to one surface of a film of an ethylene/vinyl acetate copolymer (of 5% vinyl acetate) having a thickness of 70 μm to form an adhesive layer of 20 μm thickness, and it was then dried by heating to prepare a semiconductor wafer-securing adhesive tape.

The adhesive force of the above semiconductor wafer-securing adhesive tape was measured as in Example 1. The results of the measurement of the adhesive force are given in Table 5 below.

TABLE 5

| Experiment No. | Surface state of wafer | Adhesive strength before irradiation with UV rays (g/25 mm) | Adhesive strength after irradiation with UV rays (g/25 mm) |
|---|---|---|---|
| 1 | specular | 770 | 18 |
| 2 | surface finished with #1000 | 760 | 19 |
| 3 | surface finished with #600 | 760 | 20 |

As shown in the above measurement results, the adhesive strength of the adhesive tape of the present invention after the irradiation with ultraviolet rays had an approximately uniform value irrespective of the surface state of the wafer.

When a silicon wafer having a diameter of 5 inches that was secured to the above adhesive tape was cut, irradiated with light, and subjected to pick-up testing as in Example 1, any of the chips under experiment Nos. 1 to 3 could be picked up easily.

COMPARATIVE EXAMPLE 3

To 100 pts. wt. of an acrylic adhesive (the same as in Example 3) were added 3 pts. wt. of a polyisocyanate compound (the same as in Example 3), 100 pts. wt. of a commercially-available urethane acrylate-type oligomer not containing a triazine ring or an isotriazine ring (of trade name GOSERACK UV-1700B, manufactured by Nippon Synthetic Chemical Industry Co., Ltd. (Japan)), and 1 pt. wt. of α-hydroxycyclohexyl phenyl ketone to prepare a semiconductor wafer-securing adhesive tape in the same manner as in Example 3.

With respect to the above semiconductor wafer-securing adhesive tape, the adhesive force to three surface states of a silicon wafer was measured under the same conditions as Example 3. The results of the measurement are given under experiment Nos. 1 to 3 in Table 6 below.

TABLE 6

| Experiment No. | Surface state of wafer | Adhesive strength before irradiation with UV rays (g/25 mm) | Adhesive strength after irradiation with UV rays (g/25 mm) |
|---|---|---|---|
| 1 | specular | 750 | 38 |
| 2 | surface finished with #1000 | 830 | 43 |
| 3 | surface finished with #600 | 960 | 58 |

As is apparent from the results of experiment Nos. 1 to 3 shown in Table 6, the adhesive strength of the adhesive tape after irradiation with ultraviolet rays changed due to the surface state of the wafer, and the rougher the surface, the greater the value of the adhesive strength.

When a silicon wafer having a diameter of 5 inches that was secured to the above adhesive tape was cut, irradiated with light, and subjected to pick-up testing as in Example 3, the chips could be picked up easily from the specular surface (experiment No. 1), but there was high pick-up resistance for the other surfaces (experiment Nos. 2 and 3), and some of chips could not be picked up.

EXAMPLE 4

To 100 pts. wt. of an acrylic adhesive (the same as in Example 3) were added 5 pts. wt. of a polyisocyanate compound (the same as Example 1), 100 pts. wt. of tris(1,3-diacryloxy-2-propyl-oxycarbonylamino-n-hexyl) isocyanurate as an isocyanurate compound, and 3 pt. wt. of α-hydroxycyclohexyl phenyl ketone as a photopolymerization initiator, followed by mixing to prepare a radiation-curable adhesive. The adhesive was applied to one surface of an ethylene/vinyl acetate copolymer (of 10% vinyl acetate) having a thickness of 80 μm to form an adhesive layer of 23 μm thickness, and it was then dried by heating to prepare a semiconductor wafer-securing adhesive tape.

Each silicon wafer having a diameter of 5 inches was stuck onto the above semiconductor wafer-securing adhesive tape, and the adhesive force was measured according to JIS-Z0237 before and after irradiation with ultraviolet rays. In this case, three surface states of the wafer where the adhesive tape was stuck were tested, that is, one surface was specular, one was finished with a #600 grinder manufactured by DISCO ABRASIVE SYSTEMS, Ltd. (Japan), and the other surface was finished with a #1000 grinder manufactured by DISCO ABRASIVE SYSTEMS, Ltd. (Japan). Prior to testing the surfaces had been subjected, to an etching treatment at 10° C. for 2 min. using a solution mixture of 11 pts. wt. of 70% nitric acid and 5 pts. wt. of 49% fluoric acid. The ultraviolet lamp used was a high pressure mercury vapor lamp (80 w/cm), and the irradiation time was 10 sec. The results of the measurement of the adhesive force are given in Table 7 below.

TABLE 7

| Experiment No. | Surface state of wafer | Adhesive strength before irradiation with UV rays (g/25 mm) | Adhesive strength after irradiation with UV rays (g/25 mm) |
|---|---|---|---|
| 1 | specular | 590 | 18 |
| 2 | surface finished with #1000 | 610 | 21 |
| 3 | surface finished with #600 | 600 | 23 |

As shown in the above measurement results, the adhesive strength of the adhesive tape of the present invention after the irradiation with ultraviolet rays had an approximately uniform value irrespective of the surface state of the wafer.

When a silicon wafer having a diameter of 5 inches that was secured to the above adhesive tape was cut, irradiated with light, and subjected to pick-up testing as in Example 1, any of the chips could be picked up easily from any of the said surfaces.

COMPARATIVE EXAMPLE 4

To 100 pts. wt. of an acrylic adhesive (the same as in Example 4) were added 3 pts. wt. of a polyisocyanate compound (the same as in Example 4), 50 pts. wt. of a commercially-available acrylate-type oligomer of polyester polyol not containing a triazine ring or an isotriazine ring (of trade name Queenbeam QB-416, manufactured by Japanese Geon Co., Ltd. (Japan)), and 1 pt. wt. of α-hydroxycyclohexyl phenyl ketone to prepare a semiconductor wafer-securing adhesive tape in the same manner as in Example 3.

With respect to the above semiconductor wafer-securing adhesive tape, the adhesive force to three surface states of a silicon wafer was measured under the same conditions as in Example 4. The results of the measurement are given under experiment Nos. 1 to 3 in Table 8 below.

TABLE 8

| Experiment No. | Surface state of wafer | Adhesive strength before irradiation with UV rays (g/25 mm) | Adhesive strength after irradiation with UV rays (g/25 mm) |
|---|---|---|---|
| 1 | specular | 640 | 38 |
| 2 | surface finished with #1000 | 680 | 91 |
| 3 | surface finished | 700 | 95 |

TABLE 8-continued

| Experiment No. | Surface state of wafer | Adhesive strength before irradiation with UV rays (g/25 mm) | Adhesive strength after irradiation with UV rays (g/25 mm) |
| --- | --- | --- | --- |
| | with #600 | | |

As is apparent from the measurement results in Table 8, the adhesive strength of the adhesive tape of Comparative Example 4 after irradiation with ultraviolet rays changed due to the surface state of the wafer, and the rougher the surface, the greater the value of the adhesive strength.

When a silicon wafer having a diameter of 5 inches that was secured to the above adhesive tape was cut, irradiated with light, and subjected to pick-up testing as in Example 4, the chips could be picked up easily from the specular surface (experiment No. 1), but there was high pick-up resistance for the other surfaces (experiment Nos. 2 and 3), and most of the chips could not be picked up.

EXAMPLE 5

To 100 pts. wt. of an acrylic adhesive (the same as in Example 3) were added 3 pts. wt. of a polyisocyanate compound (the same as in Example 1), 100 pts. wt. of tris(1,3-diacryloxy-2-propyl-oxycarbonylamino-n-hexyl) isocyanurate as an isocyanurate compound, 10 pt. wt. of a commercially-available acrylate-type oligomer of polyester polyol not containing a triazine ring or an isotriazine ring (of trade name ARONIX M-400, manufactured by Toa Gosei Chemical Industry, Co., Ltd. (Japan)) and 1 pt. wt. of α-hydroxycyclohexyl phenyl ketone to prepare a radiation-curable adhesive in the same was as in Example 3.

The adhesive force of the above semiconductor wafer-securing adhesive tape was measured under the same conditions as in Example 4, with the surface state of the silicon wafer made different. The results of the measurement are given in Table 9 below.

TABLE 9

| Experiment No. | Surface state of wafer | Adhesive strength before irradiation with UV rays (g/25 mm) | Adhesive strength after irradiation with UV rays (g/25 mm) |
| --- | --- | --- | --- |
| 1 | specular | 640 | 29 |
| 2 | surface finished with #1000 | 690 | 33 |
| 3 | surface finished with #600 | 730 | 34 |

As is apparent from the results of the measurement shown in Table 9, similar to the adhesive tape in Example 4, the adhesive strength of the adhesive tape in Example 5 was not changed by the surface state of the wafer, and it was possible to increase the adhesive strength after irradiation with ultraviolet rays by the additional use of an acrylate of polyester polyol.

EXAMPLE 6

A radiation-curable adhesive was prepared by the same procedure as in Example 2. Then the adhesive was applied to one surface of a multi-layer film having a thickness of 80 μ, constructed in a manner described hereinafter so that it may form into a thickness of 20 μm, and then it was dried by heating, resulting in a semiconductor wafer-securing adhesive tape. The above-described multi-layer film was a co-extruded three-layer film that comprised a main layer formed of polybutene-1 of thickness 50 μm and two sublayers: a first sublayer applied to one surface of the main layer formed of a copolymer of ethylene and vinyl acetate (EVA copolymer) of thickness 10 μm, and a second sublayer applied to the other surface of the main layer formed of the same copolymer of thickness 20 μm. Thereafter the second sublayer of 20 μm thickness was subjected to a corona treatment, and then the adhesive was applied thereto.

A silicon wafer 5 inches in diameter was stuck on the so-obtained semiconductor wafer-securing adhesive tape and cut into chips of size 5 mm × 5 mm with dicing equipment. The silicon wafer was subjected to #1000 surface finishing prior to being stuck to the tape. The ultraviolet source was a high pressure mercury vapor lamp (80 w/cm), and irradiation was carried out for 10 seconds.

After irradiation to the 5-inch silicon wafer stuck on the adhesive tape, a pick-up test was conducted on the chips. All chips were readily picked up.

EXAMPLE 7 AND COMPARATIVE EXAMPLE 5

A two-layer film having a whole thickness of 150 μm was prepared by laminating a film of an ionomer resin (manufactured by Mitsui Dupont Polychemical Co., Ltd. (Japan) and sold under the trade name HI-MILAN 1652) of 50 μm thickness on one surface of a film formed of polyethylene terephthalate (PET) into a thickness of 150 μm while extruding.

To the ionomer resin layer of the two-layer film was applied an ultraviolet-curable adhesive that was prepared by repeating the procedure in Example 1, except that 60 pts. wt. of the isocyanurate compound was changed to 40 pts. wt. of dipentaerythritol hexacrylate, such that the thickness of the adhesive after drying was 20 μm, resulting in an ultraviolet-curable adhesive tape.

A thin sheet of alumina (thickness: 0.5 mm) was stuck on the ultraviolet-curable adhesive tape and cut into chips of size 5 mm × 10 mm with a dicer. After cutting, the chips were exposed to ultraviolet rays under conditions similar to those in Example 6 described above, and then they were pelled from the tape. All operations described above were carried out without difficulty.

For comparison, the above-described adhesive was applied to the above-described PET film and an ionomer resin film of 150 μm thickness, respectively, to obtain adhesive tapes (Comparative Example 5). The PET adhesive tape encountered a problem in that chips were scattered during the dicing or cutting of the tape, and the ionomer resin film tape was deformed after the irradiation by ultraviolet rays, such that the aligning properties of the chips were deteriorated.

EXAMPLE 8

A forming line including three extruders was used for preparing a three-layer film that comprised a main layer (thickness: 60 μm) formed of a polymer alloy containing a thermoplastic elastomer (MK resin: MK-1, manufactured by Dai Nippon Plastic Co., Ltd. (Japan)) and two sublayers: a first sublayer (thickness: 20 μm) of low-density polyethylene (manufactured by Tosoh Co., Ltd. and sold under the trade name Petrothene 170R), and a second sublayer (thickness: 10 μm) of ethylene-vinyl acetate copolymer (manufactured by Tosoh Co., Ltd.

(Japan) and sold under the trade name Ultrathene 515F).

The same adhesive as in Example 6 described above was applied to the ethylene-vinylacetate copolymer sublayer of the three-layer film such that the thickness of the adhesive after drying was 20 μm, resulting in an ultraviolet-curable adhesive tape. On the so-obtained tape was stuck a silicon wafer similar to that used in Example 6, which was then cut into chips of size 2 mm×2 mm. Subsequently the tape was expanded to increase the intervals between the chips using an expander, resulting in intervals of 200 μm. Thereafter the tape was subjected to ultraviolet irradiation and then the chips were peeled off the tape by vacuum suction. The above operations were smoothly carried out without difficulty, and no retention of adhesive on the chips was observed.

EXAMPLE 9

A three-layer film that comprised a main layer (thickness: 80 μm) of olefin elastomer (of trade name Sumitomo TPE1700, manufactured by Sumitomo Chemical Co., Ltd. (Japan)) and two sublayers (each thickness: 10 μm), each formed of ethylene-vinyl acetate copolymer (the same in Example 8) into a thickness of 10 μm, was prepared according to a co-extrusion process.

The same adhesive as in Example 6 was applied to the three-layer film such that the thickness of the adhesive after drying was 20 μm, resulting in an ultraviolet-curable adhesive tape.

On the so-prepared tape was stuck a specular-finished silicon wafer of 4 inches in diameter, which was then diced into chips of size 2 mm×2 mm. Then the tape was expanded to increase the intervals between the chips to 300 μm. The arrangement and aligning of the chips were satisfactory.

Subsequently, ultraviolet rays were irradiated to the rear surface of the chips through the tape, and then the chips were pelled from the tape by vacuum suction. The above-described operations were smoothly carried out without difficult. No retention of adhesive on the tape was observed.

EXAMPLE 10

A radiation-curable adhesive was prepared by repeating the procedure in Example 1, except that the part by weight of the isocyanurate compound used was changed from 60 pts. wt. to 150 pts. wt.

The so-prepared adhesive was applied in a thickness of 20 μm on one surface of a support film of 70 μm thickness formed according to a co-extrusion process that comprised two outer resin layers of ethylene-vinyl acetate copolymer and an intermediate resin layer of high-density polyethylene (Vicat softening point of 127° C.; JIS K6760) interposed between the outer layers. Then the adhesive was dried by heating, to thereby obtain an ultraviolet-curable adhesive tape. At this time the intermediate polyethylene layer and each of the outer ethylene-vinylacetate copolymer layers were set to be 50 μm and 10 μm in thickness, respectively.

A silicon wafer 5 inches in diameter was stuck on the ultraviolet-curable adhesive tape and diced into chips, each 1 mm² in area. Visual observation of the tape after dicing indicated that no slack of the tape occurred due to the weight of the semiconductor wafer and the extension of the tape. The housing of the tape into a carrier cassette for the purpose of transferring it to a subsequent ultraviolet irradiation was smoothly conducted without difficulty due to the slack and/or extension of the tape.

Then, ultraviolet irradiation was carried out on the tape in order to deteriorate the adhesive force holding the silicon wafer chips on the adhesive tape, during which no slack, extension of the tape, or non-uniformity of the intervals between the chips were observed. Rather it was observed that the adhesive tape absorbs slightly the slack of the tape that occurs when the tape is applied to a tape-cutting frame or the like, so that the tape may be free of any slack.

Thus, the example was satisfactorily practiced without encountering any difficulty, such as damage of the chips due to contact between the tapes in the carrier cassette, a problem in picking-up the chips after ultraviolet irradiation, or the like.

EXAMPLE 11

Example 10 was substantially repeated to prepare an ultraviolet-curable adhesive tape, except that high-density polyethylene having a Vicat softening point of 118° C. was used as high-density polyethylene for the support film of the ultraviolet-curable adhesive tape.

On the so-prepared ultraviolet-curable adhesive tape was stuck a silicon wafer of diameter 5 inches, which was then diced into chips of area 1 mm². Visual observation of the tape after dicing indicated that slack of the tape occurs due to the weight of the tape.

Then ultraviolet irradiation was carried out on the tape in order to deteriorate the adhesive force holding the silicon wafer chips on the adhesive tape. The irradiation caused a slight wrinkling on the tape due to a difference in the shrinkage between the longitudinal and lateral directions. Thus, the tape obtained in the example caused the aligning of the chips to be somewhat deteriorated due to non-uniformity of the intervals between the chips, as compared to that in Example 10. This resulted in a failure in picking-up of the chips, damage of the chips due to contact between the tapes, and thelike. Nevertheless, the tape could be put to practical use.

EXAMPLE 12

A radiation-curable adhesive was prepared by repeating the same procedure in Example 1, except for further adding 20 pts. wt. of an urethane acrylate compound of IDABEAM UK-6038 (trade name, manufactured by Mitsubishi Rayon Co., Ltd. (Japan)). The so-prepared adhesive was applied in a thickness of 10 μm on one surface of a support film of 70 μm thickness formed according to a co-extrusion process so as to comprise two outer layers of ethylene-vinyl acetate copolymer and an intermediate layer of flexible polyvinyl chloride interposed between the outer layers. Then the adhesive was dried by heating, to thereby obtain a radiation-curable adhesive tape.

A silicon wafer of diameter 5 inches was stuck on the so-obtained radiation-curable adhesive tape, and the adhesive force of the tape before and after ultraviolet irradiation was measured according to JIS Z0237. The surface of the silicon wafer to be stuck on the adhesive tape was subjected to two kinds of surface finishing, that is, specular finish and lapping #600 (providing a surface with fine roughness corresponding to U.S. mesh #600).

Then, the silicon wafer of 5 inches in diameter stuck on the adhesive tape was cut, using a dicing saw, into chips of size 3 mm×3 mm, after which they were subjected to ultraviolet curing. Subsequently, the tape was expanded by means of a wafer expander (air pressure: 2.0 kg/cm$^2$) to measure the intervals between the chips. The results are shown in Table 10.

The tensile strength and elongation characteristics of the urethane acrylate compound used in the examples and comparative examples described above, and the rubber-like elasticity of the support film used therein, were measured according to JIS K7113 and JIS Z0237, respectively. The results are shown in Tables 11 and 12.

EXAMPLE 13

Example 12 was substantially repeated to prepare a radiation-curable adhesive tape, except that to 100 pts. wt. of the same acrylic adhesive as in Example 12 were added 3 pts. wt. of the same polyisocyanate compound as in Example 12, 60 pts. wt. of the same isocyanurate compound as in Example 12, and 1 pt. wt. of the same photopolymerization initiator as in Example 12.

EXAMPLE 14

Example 12 was substantially repeated to prepare a radiation-curable adhesive tape, except that 20 pts. wt. of an urethane acrylate compound (trade name DIABEAM UK-6037, manufactured by Mitsubishi Rayon Co., Ltd. (Japan)) was used instead of DIABEAM UK-6038.

Results of testing on the radiation-curable adhesion tape prepared in the above-described comparative examples are also shown in Tables 10 to 12.

TABLE 10

| | Measurement of Adhesive Force (g/25 mm) | | | | Interval between chips, after tape expanding (μm) | |
|---|---|---|---|---|---|---|
| | Specular | | #600 | | | |
| | Before UV Irradiation | After UV Irradiation | Before UV Irradiation | After UV Irradiation | Specular | #600 |
| Example 12 | 240 → | 15 | 330 → | 18 | 450 | 430 |
| Example 13 | 260 → | 10 | 370 → | 15 | 65 | 65 |
| Example 14 | 240 → | 16 | 335 → | 18 | 100 | 105 |

The interval between chips includes 40 μm, which is the thickness of the dicing blade.

The tensile strength and elongation characteristics of the support film and urethane acrylate compound are shown in Tables 11 and 12.

TABLE 11

| | Support Film Example 12 |
|---|---|
| 50%/25% Modulus | 1.30–1.45 |
| 25% Modulus (kg/cm$^2$) | 50–60 |

TABLE 12

| | Urethane Acrylate Compound | |
|---|---|---|
| | Example 12 | Example 14 |
| Tensile Strength at Break (kg/cm$^3$) | 30–40 | 130–140 |
| Elongation at Break (%) | 120–130 | 70–80 |

EXAMPLES 15 AND 16

A radiation-curable adhesive was prepared by repeating the same procedure as in Example 1, except for further adding 2 pts. wt. of a silicone acrylate of six (6) functions (of trade name Ebecryl 360, manufactured by UCB Chemical Sector). The so-prepared adhesive was applied in a thickness of 15 μm on one surface of a polyethylene terephthalate film having a thickness of 50 μm, and then it was heated for drying to prepare a wafer-securing adhesive tape (Example 15). Further, the above-described procedure was repeated, except that silicone acrylate of two (2) functions (of trade name Ebecryl 350, manufactured by VCB Chemical Sector) was used, resulting in an adhesive tape (Example 16).

On each of the so-obtained wafer-adhering adhesive tapes was stuck a silicon wafer of diameter 5 inches, and the adhesive force of the tape before and after ultraviolet irradiation was measured according to JIS Z0237. On the surface of the silicon wafer to be stuck onto the adhesive tape was deposited gold by vapor deposition. The ultraviolet source was a high-pressure mercury vapor lamp (80 w/cm), and ultraviolet irradiation was carried out for 10 seconds. The results of the measurement of the adhesive force are shown in Table 13.

TABLE 13

| | Adhesive Force before UV-Irradiation (g/25 mm) | Adhesive Force before UV-Irradiation (g/25 mm) |
|---|---|---|
| Example 15 | 1,030 | 24 |
| Example 16 | 1,010 | 25 |

As is apparent from the results in Table 13, the silicone acrylate-containing adhesive tapes of Examples 15 and 16 exhibited substantially the same adhesive force before ultraviolet irradiation, and they were substantially decreased in adhesive force after the irradiation.

The silicon wafer, 5 inches in diameter, stuck onn the adhesive tape was cut into chips of the relatively large size of 5 mm×5 mm, using a dicing saw, and they were then subjected to irradiation by means of the high pressure mercury vapor lamp (80 w/cm) for 10 seconds, after drying. Then, a pick-up test was conducted on the chips. As a result, it was found that the chips of Examples 15 and 16 could be readily picked up. Also, the adhesive tape of Example 15 using silicone acrylate of six (6) functions caused contamination of the chips to be decreased compared to that of Example 16, which used silicone acrylate of two (2) functions.

EXAMPLE 17 AND COMPARATIVE EXAMPLE 6

To 100 pts. wt. of an acrylic adhesive (the same as in Example 2) were added 3 pts. wt. of a polyisocyanate compound (the same as in Example 2), 100 pts. wt. of urethane acrylate oligomer (manufactured by Nippon Synthetic Chemical Industry Co., Ltd. (Japan) and sold under the trade name GOSERACK UV-1700), 4 pts. wt. silicone acrylate of six (6) functions (manufactured by UCB Chemical Sector and sold under the trade name Ebecryl 360) and 1 pt. wt. of hydroxycyclohexyl phenyl ketone as a photopolymerization initiator, and they were mixed together to prepare a radiation-curable adhesive. The so-prepared adhesive was applied in a thickness of 20 μm on one surface of an ethylene-vinyl acetate copolymer (content of vinyl acetate: 5%) film of 70 μm thickness, and then it was dried by heating, to thereby obtain a semiconductor wafer-securing adhesive tape (Example 17). For comparison, the above procedure of the example was substantially repeated, except that the silicone acrylate was not added, resulting in an adhesive tape (Comparative Example 6).

The adhesive force of each of the so-prepared adhesive tapes was measured according to the procedure described in Example 15. The results are shown in Table 14.

TABLE 14

|  | Adhesive Force before UV-Irradiation (g/25 mm) | Adhesive Force before UV-Irradiation (g/25 mm) |
|---|---|---|
| Example 17 | 950 | 32 |
| Comparative Example 6 | 980 | 58 |

As is apparent from the results of Table 14, the silicone acrylate-containing adhesive tape of the present invention was substantially decreased in adhesive force after ultraviolet irradiation.

A silicon wafer of 5 inches in diameter stuck on each of the adhesive tapes was cut into chips, subjected to ultraviolet irradiation, and tested in substantially the same manner as Example 15. The chips of Comparative Example 6 exhibited high resistance to pick-up testing, such that a part of the chips could not be picked up. On the contrary, the chips of Example 17 could be readily picked up.

Having described our invention as related to the embodiment, it is our intention that the invention be not limited by any of the details of the description, unless otherwise specified, but rather be construed broadly within its spirit and scope as set out in the accompanying claims.

What is claimed is:

1. A radiation-curable adhesive tape which comprises a radiation-curable adhesive layer that is formed on a radiation-transmitting substrate that contains 100 parts by weight of an acrylic adhesive, 5 to 500 parts by weight of a compound having a carbon-carbon double bond, and 0.01 to 20 parts by weight of a silicone acrylate compound.

2. The radiation-curable adhesive tape as claimed in claim 1, wherein the compound having carbon-carbon double bonds is selected from cyanurate or isocyanurate compounds and polyacrylates or polymethacrylates of aliphatic polyols.

3. The radiation-curable adhesive tape as claimed in claim 1, the radiation-curable adhesive layer comprises 60–150 parts by weight of cyanurate or isocyanurate compound for 100 parts by weight of acrylic adhesive.

4. The radiation-curable adhesive tape as claimed in claim 1, wherein the radiation-curable adhesive layer further comprises 0.5 to 4 parts by weight of silicone acrylate compound for 100 parts by weight of acrylic adhesive.

5. The radiation-curable adhesive tape as claimed in claim 1, which comprises a separator film on the radiation-curable adhesive layer.

6. The radiation-curable adhesive tape as claimed in claim 1, wherein the radiation is ultraviolet ray.

7. A radiation-curable adhesive tape which comprises a radiation-transmitting multi-layer film comprising at least three radiation-transmitting resin layers, wherein a soft poly(vinyl chloride) or an elastomer is used as an intermediate layer, and the radiation-transmitting film having a radiation-curable adhesive layer formed thereon which comprises 100 parts by weight of an acrylic adhesive and 5 to 500 parts by weight of at least one isocyanurate compound selected from the group consisting of:

tris (acryloxyethyl) isocyanurate,
tris (methacryloxyethyl) isocyanurate,
tris-4-acryloxy-n-butylisocyanurate,
tris (1,3-diacryloxy-2-propyloxycarbonylamino-n-hexyl) isocyanurate,
tris (1-acryloxy-3-methacryloxy-2-propyloxycarbonylamino-n-hexyl) isocyanurate, and
bis (2-acryloxyethyl)-2-(5-acryloxy)hexyloxyethyl isocyanurate.

8. The radiation-curable adhesive tape as claimed in claim 7, wherein the radiation-transmitting multi-layer film comprises a soft poly(vinyl chloride) intermediate layer.

9. The radiation-curable adhesive tape as claimed in claim 7, wherein the radiation-transmitting multi-layer film comprises an elastomeric intermediate layer.

10. The radiation-curable adhesive tape as claimed in claim 7, wherein the radiation-transmitting multi-layer film comprises at least one layer of polyethylene.

11. The radiation-curable adhesive tape as claimed in claim 7, wherein the radiation-transmitting multi-layer film comprises at least one high density polyethylene or polypropylene layer having a vicat softening point of 120° C. or over.

12. The radiation-curable adhesive tape as claimed in claim 7, wherein the radiation-curable adhesive layer further commprises 0.01 to 20 parts by weight of silicon acrylate compound for 100 parts by weight of acrylic adhesive.

13. The radiation-curable adhesive tape as claimed in claim 7, wherein the radiation-curable adhesive layer comprises 60–150 parts by weight of isocyanurate compounds for 100 parts by weight of acrylic adhesive.

14. The radiation-curable adhesive tape as claimed in claim 7, wherein the radiation-curable adhesive layer further comprises 0.5 to 4 parts by weight of silicone acrylate compound for 100 parts by weight of acrylic adhesive.

15. A radiation-curable adhesive tape, having a ratio of 50% modulus (20° C.) to 25% modulus (20° C.) of at least 1.2 with the 25% modulus (20° C.) being 50 kg/cm² or less, which tape comprises a radiation transmitting substrate comprising at least two kinds of resin layers and being composed of a multi-layer film having at least three layers including an intermediate layer having rubber-like properties and being selected from a soft poly(vinyl chloride) resin layer or an elastomer, and a radiation-curable adhesive layer comprising an acrylic adhesive formed on one side of the substrate containing 5 to 500 parts by weight of an isocyanurate compound per 100 parts by weight of the acrylic adhesive; the isocyanurate compound being selected from the group consisting of:

tris (acryloxyethyl) isocyanurate,
tris (methacryloxyethyl) isocyanurate,
tris-4-acryloxy-n-butylisocyanurate, tris (1,3-diacryloxy-2-propyloxycarbonylamine-n-hexyl) isocyanurate,
tris (1-acryloxy-3-methacryloxy-2-propyloxycarbonylamino-n-hexyl) isocyanurate and
bis (2-acryloxyethyl)-2-(5-acryloxy)hexyloxyethylisocyanurate.

16. The radiation-curable adhesive tape as claimed in claim 15, wherein the intermediate layer having rubber-like properties is a soft poly(vinyl chloride) resin layer.

17. The radiation-curable adhesive tape as claimed in claim 15, wherein the intermediate layer having rubber-like properties is an elastomer layer.

18. The radiation-curable adhesive tape as claimed in claim 15, wherein an outer layer of the multi-layer film is composed of a resin selected from polyethylene, ethylene/propylene copolymer, polypropylene, ethylene/vinyl acetate copolymer, polymethylpentene, ethylene/ethyl acrylate copolymer, ethylene/methyl acrylate copolymer, and ethylene/acrylic acid copolymer.

19. The radiation-curable adhesive tape as claimed in claim 15, wherein an outer layer of the multi-layer film is composed of a ethylene/vinyl acetate copolymer.

20. The radiation-curable adhesive tape as claimed in claim 15, wherein the tape is for expansion use.

21. The radiation-curable adhesive tape as claimed in claim 15, wherein the radiation-curable adhesive layer further comprises 0.01 to 20 parts by weight of a silicone acrylate compound for 100 parts by weight of acrylic adhesive.

22. The radiation-curable adhesive tape as claimed in claim 15, wherein the radiation-curable adhesive layer comprises 60-150 parts by weight of isocyanurate compounds for 100 parts by weight of acrylic adhesive.

23. The radiation-curable adhesive tape as claimed in claim 15, wherein the radiation-curable adhesive layer further comprises 0.5 to 4 parts by weight of silicone acrylate compound for 100 parts by weight of acrylic adhesive.

24. The radiation-curable adhesive tape as claimed in claim 15, which further comprises a separator film on the radiation-curable adhesive layer.

25. The radiation-curable adhesive tape as claimed in claim 15, wherein the tape is radiation-curable with ultraviolet ray.

* * * * *